(12) United States Patent
Nishioka

(10) Patent No.: US 11,056,623 B2
(45) Date of Patent: Jul. 6, 2021

(54) LIGHT-EMITTING DEVICE AND METHOD OF MANUFACTURING LIGHT-EMITTING DEVICE

(71) Applicant: NICHIA CORPORATION, Anan (JP)

(72) Inventor: Yoshihiko Nishioka, Itano-gun (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/689,260

(22) Filed: Nov. 20, 2019

(65) Prior Publication Data

US 2020/0161513 A1 May 21, 2020

(30) Foreign Application Priority Data

Nov. 21, 2018 (JP) .............................. JP2018-218046

(51) Int. Cl.
*H01L 33/50* (2010.01)
*H01L 33/00* (2010.01)
*H01L 33/60* (2010.01)

(52) U.S. Cl.
CPC .......... *H01L 33/508* (2013.01); *H01L 33/005* (2013.01); *H01L 33/504* (2013.01); *H01L 33/60* (2013.01)

(58) Field of Classification Search
CPC ... H01L 33/508; H01L 33/504; H01L 33/005; H01L 33/60; H01L 33/50; H01L 33/46; H01L 33/44; H01L 33/58
USPC .......................................................... 257/98
See application file for complete search history.

(56) References Cited

U.S. PATENT DOCUMENTS

| | | | |
|---|---|---|---|
| 2014/0264425 A1* | 9/2014 | Chida | ................ H01L 51/0097 257/99 |
| 2015/0124457 A1 | 5/2015 | Sanga et al. | |
| 2015/0255437 A1 | 9/2015 | Moosburger | |
| 2015/0263242 A1 | 9/2015 | Tomizawa et al. | |
| 2015/0295145 A1 | 10/2015 | Saito et al. | |
| 2016/0126422 A1* | 5/2016 | Jeon | ........................ H01L 33/20 257/98 |
| 2017/0244010 A1* | 8/2017 | Kim | .................... H01L 25/0753 |
| 2017/0256674 A1 | 9/2017 | Hashimoto | |

(Continued)

FOREIGN PATENT DOCUMENTS

| | | |
|---|---|---|
| JP | 2010-258281 A | 11/2010 |
| JP | 2013-110199 A | 6/2013 |

(Continued)

*Primary Examiner* — Sheikh Maruf
(74) *Attorney, Agent, or Firm* — Squire Patton Boggs (US) LLP

(57) ABSTRACT

The light-emitting device includes a light-emitting element, a light-transmissive member, a light-blocking layer and a light-reflective member. The light-transmissive member has a first main surface and a second main surface opposite to each other. The first main surface and the second main surface are smaller than a light-emitting surface of the light-emitting element. The first main surface faces the light-emitting surface of the light-emitting element. The light-blocking layer is disposed on the light-emitting surface to cover a region between an outer edge of the light-emitting surface and an outer edge of the first main surface. The light-reflective member covers at least a portion of lateral surfaces of the light-emitting element and at least a portion of the light-transmissive member. The light-blocking layer extends inward of the outer edge of the first main surface.

12 Claims, 5 Drawing Sheets

(56) References Cited

U.S. PATENT DOCUMENTS

| | | | |
|---|---|---|---|
| 2017/0294417 A1* | 10/2017 | Edmond | H01L 33/504 |
| 2018/0182933 A1* | 6/2018 | Abe | F21K 9/60 |
| 2018/0229491 A1 | 8/2018 | Sanga et al. | |
| 2019/0189683 A1* | 6/2019 | Hin | H01L 21/6836 |

FOREIGN PATENT DOCUMENTS

| | | |
|---|---|---|
| JP | 2015-111661 A | 6/2015 |
| JP | 2015-173142 A | 10/2015 |
| JP | 2015-530754 A | 10/2015 |
| JP | 2015-204300 A | 11/2015 |
| JP | 2017-157723 A | 9/2017 |

* cited by examiner

LIGHT-EMITTING DEVICE AND METHOD OF MANUFACTURING LIGHT-EMITTING DEVICE

CROSS-REFERENCE TO RELATED APPLICATION

This application claims priority to Japanese Patent Application No. 2018-218046, filed on Nov. 21, 2018, the disclosure of which is hereby incorporated by reference in its entirety.

BACKGROUND

Field

The present disclosure relates to a light-emitting device and a method of manufacturing light-emitting device.

Description of the Related Art

Light-emitting devices including light-emitting elements such as LEDs have been used as light sources for televisions, smartphones, electronic bulletin boards, and the like. It has been proposed that the luminance of such light-emitting devices be enhanced by, for example, reducing the area of the light-emitting surface of the light-emitting device. For example, Japanese Patent Publication No. 2013-110199 discloses a light-emitting device including a phosphor plate having smaller area than the light-emitting surface of an LED element.

SUMMARY

A light-emitting device is expected to be reliable in addition to offering high luminance, but currently such demands are not sufficiently met.

Accordingly, an object of the present disclosure is to provide a light-emitting device offering high luminance and good reliability.

To achieve the above object, a light-emitting device according to certain embodiments of the present disclosure includes a light-emitting element, a light-transmissive member, a light-blocking layer and a light-reflective member. The light-transmissive member has a first main surface and a second main surface opposite to each other. The first main surface and the second main surface are smaller than a light-emitting surface of the light-emitting element. The first main surface faces the light-emitting surface of the light-emitting element. The light-blocking layer is disposed on the light-emitting surface to cover a region between an outer edge of the light-emitting surface and an outer edge of the first main surface. The light-reflective member covers at least a portion of lateral surfaces of the light-emitting element and at least a portion of the light-transmissive member. The light-blocking layer extends inward of the outer edge of the first main surface.

According to certain embodiments of the present disclosure, a light-emitting device having the above-described structure offers high luminance and good reliability.

DETAILED DESCRIPTION

A light-emitting device and a manufacturing method of light emitting device according to embodiments of the present disclosure are described referring to the accompanying drawings.

Figure 1:
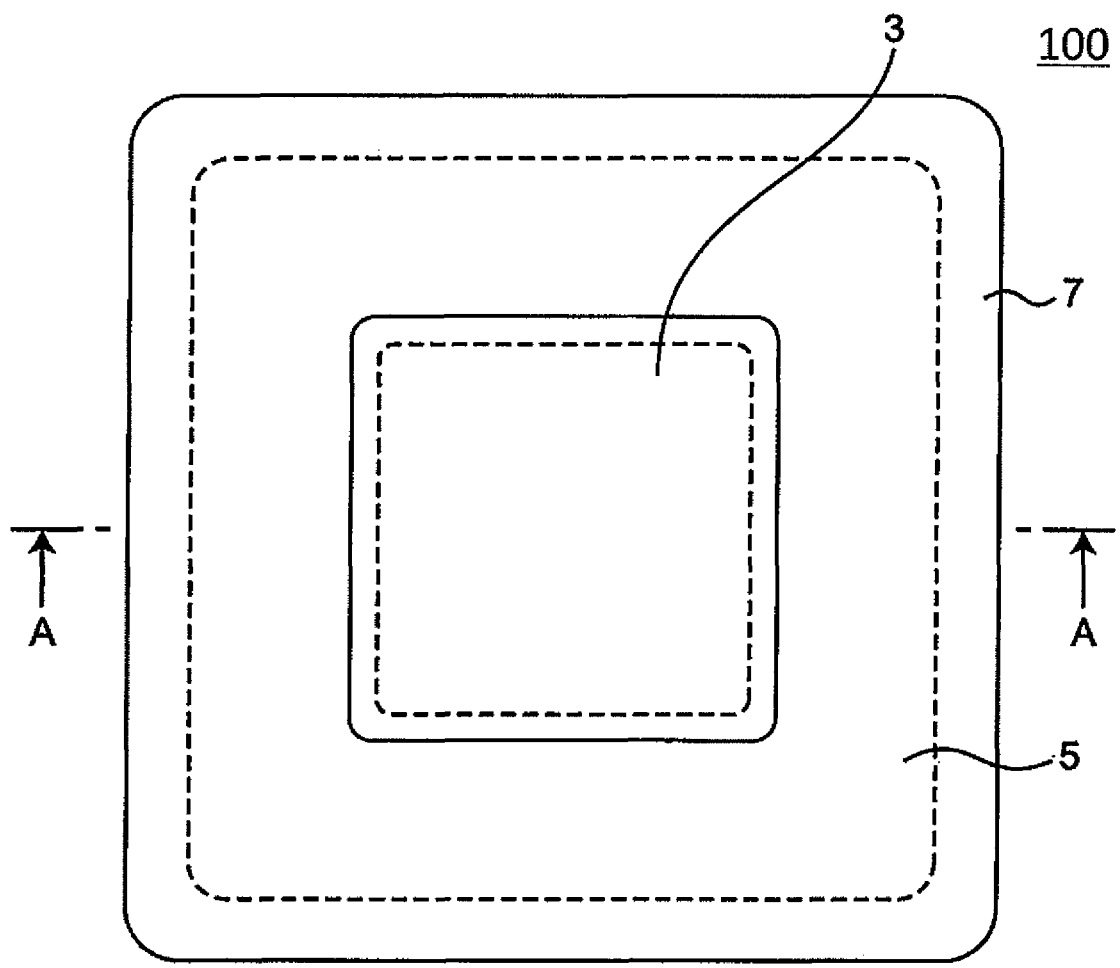
FIG. 1 is a schematic plan view of a light-emitting device according to an embodiment.
Figure 2:
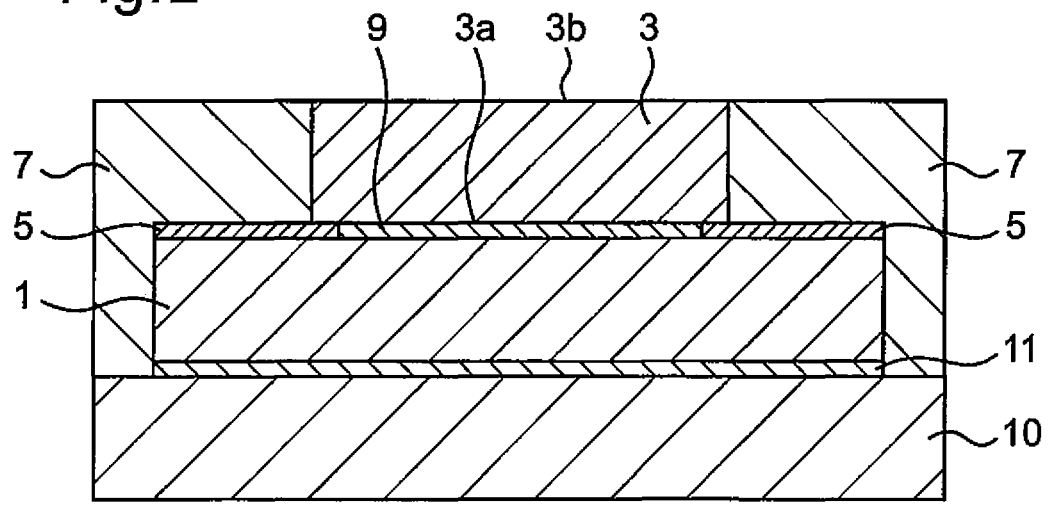
FIG. 2 is a schematic cross-sectional view taken along the line A-A of FIG. 1.

As shown in FIG. 1 and FIG. 2, a light-emitting device 100 according to certain embodiments includes a light-emitting element 1, a light-transmissive member 3, a light-blocking layer 5 and a light-reflective member 7. The light-transmissive member 3 has a first main surface 3a and a second main surface 3b opposite to each other. The light-transmissive member 3 is disposed such that the first main surface 3a faces a light-emitting surface of the light-emitting element 1. The light-blocking layer 5 is disposed on the light-emitting surface of the light-emitting element 1 to cover a region between the outer edge of the light-emitting surface of the light-emitting element 1 and the outer edge of the first main surface 3a of the light-transmissive member 3. The light-reflective member 7 covers at least a portion of lateral surfaces of the light-emitting element 1 and at least a portion of lateral surface of the light-transmissive member 3. The light-emitting surface of the light-emitting element 1 indicates the upper surface, which serves as the main light-emitting surface of the light-emitting element 1. The light-reflective member 7 covers at least a portion of lateral surfaces of the light-emitting element 1 and at least a portion of lateral surfaces of the light-transmissive member 3 such that the second main surface 3b of the light transmissive member 3 is exposed. The second main surface 3b of the light transmissive member 3 serves as the light exiting surface of the light-emitting device. In the light-emitting device 100, the light-blocking layer 5 extends inward of the outer edge of the first main surface 3a of the light-transmissive member 3.

The following describes various modifications of the light-emitting device.

In the light-emitting device 100, the light-blocking layer 5 covers the region between the outer edge of the light-emitting surface of the light-emitting element 1 and the outer edge of the first main surface 3a as shown in FIG. 2. This structure blocks light traveling upward from the light-emitting surface of the light-emitting element 1, thereby reducing leakage of light from the region other than the upper surface of the light-transmissive member 3 which is the light-emitting surface side of the light-emitting device 100.

In the light-emitting device 100, the area of the second main surface 3b of the light-transmissive member 3 serving as the light-emitting surface of the light-emitting device is smaller than the area of the light-emitting surface of the light-emitting element 1. As the area of the second main surface 3b of the light-transmissive member 3 is smaller than the area of the light-emitting surface of the light-emitting element 1 as described above, light emitted from the light-emitting surface of the light-emitting element 1 can exit from the light-emitting surface of the light-emitting device with a smaller area. This can provide the higher luminance light-emitting device 100. At this time, for example, the area ratio between the second main surface of the light-transmissive member 3 and the light-emitting surface of the light-emitting element 1 preferably in the range of 0.5:1 to 1:1.

Figure 3:
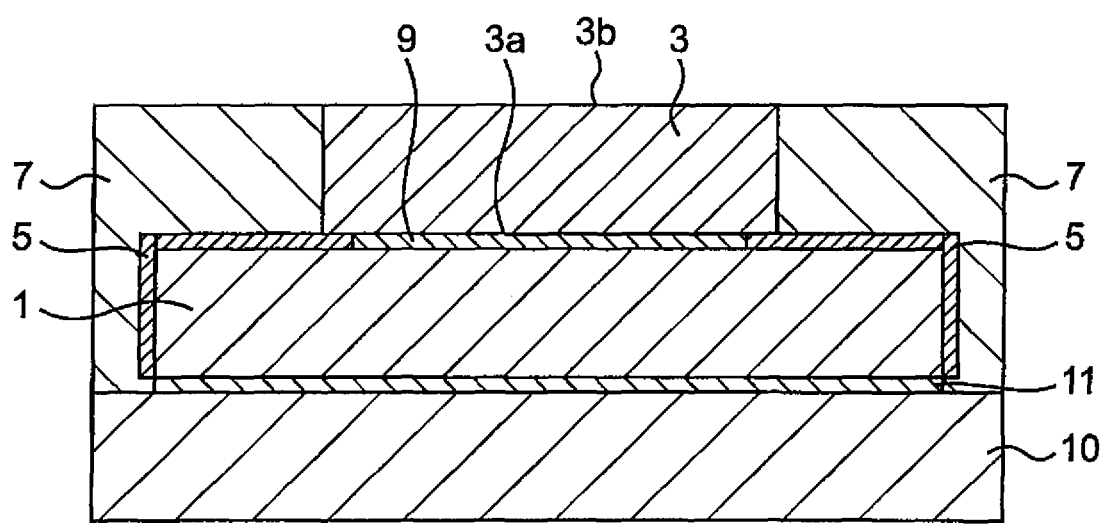
FIG. 3 is a schematic cross-sectional view of a light-emitting device according to modification different from the light-emitting device shown in FIG. 2.

In the light-emitting device according to the embodiment shown in FIG. 2, the light-blocking layer 5 is disposed on the light-emitting surface of the light-emitting element 1 to cover the region between the outer edge of the light-emitting surface of the light-emitting element 1 and the outer edge of the first main surface 3a. However, in the light-emitting device according to certain embodiments, the light-blocking layer 5 can extend to lateral surfaces of the light-emitting element 1 to cover at least a portion of the lateral surfaces as shown in FIG. 3. This structure reduces leakage of light from the lateral surfaces of the light-emitting device 100 as well as leakage of light from the region other than the light-emitting surface of the light-emitting device 100.

For example, in the case in which a light-emitting element with a dimension of 1.0 mm×1.0 mm is used for the light-emitting device, the second main surface 3b of the light-transmissive member 3 serving as the light-emitting surface of the light-emitting device has a dimension of about 0.8 mm×0.8 mm. For example, the light-transmissive member 3 has a plate shape, and the first main surface 3a of the light-transmissive member 3 is substantially the same size as the second main surface 3b. In this structure, for example, the length of the portion of the light-blocking layer 5 extending inward of the outer edge of the first main surface of the light-transmissive member 3 in a cross-sectional view is about 0.05 mm.

The following describes constituent members of the light-emitting device according to certain embodiments.

Mounting Board 10

A mounting board 10 is a member supporting the light-emitting element 1 and other constituent members and is provided with wiring for electrically connecting the electrodes of the light-emitting element 1 to external electrodes. A preferable main material of the mounting board 10 is an insulating material that is less likely to transmit light emitted from the light-emitting element 1 and extraneous light. Specific examples of the material include ceramics such as alumina and aluminum nitride and resins such as phenolic resins, epoxy resins, polyimide resins, BT resins, and polyphthalamide. In the case in which a resin is used, an inorganic filler, such as glass fiber, silicon oxide, titanium oxide, and alumina, can be mixed with the resin as appropriate. Such a filler can improve the mechanical strength and the light reflectance, and reduce the thermal expansion coefficient. The mounting board 10 can be a metal member provided with an insulating material on its surface. The wiring is formed into a predetermined pattern on the insulating material. The material of the wiring can be at least one selected from among gold, silver, copper, and aluminum. The wiring can be formed by plating, vapor deposition, sputtering, or the like.

Light-Emitting Element 1

A light emitting diode is preferably used as the light-emitting element 1. Any appropriate wavelength can be selected as the emission wavelength of the light-emitting element. Examples of a blue- or green-light emitting element include a light-emitting element including a nitride semiconductor ($In_XAl_YGa_{1-X-Y}N$, where $0≤X$, $0≤Y$, and $X+Y≤1$), ZnSe, or GaP. For a red-light emitting element, GaAlAs, AlInGaP, or the like can be used. A semiconductor light-emitting element made of another material can also be used. The composition, emission color, size, and number of the light-emitting element to be used can be appropriately selected depending on the purpose. In the case in which the light-emitting device contains a phosphor, a nitride semiconductor ($In_XAl_YGa_{1-X-Y}N$, where $0≤X$, $0≤Y$, and $X+Y≤1$) is suitable because it can emit light with short wavelengths that can efficiently excite the phosphor. The emission wavelength can be selected by changing the materials for the semiconductor layer and their mixing ratio.

For example, the light-emitting element 1 used in the light-emitting device according to certain embodiments includes positive and negative electrodes on the same surface. In the light-emitting device 100 shown in FIG. 2, the light-emitting element 1 is flip-chip mounted on or above the mounting board 10 such that the lower surface opposite to the upper surface serving as the light-emitting surface of the light-emitting element 1 serves as the mounting surface. Specifically, positive and negative electrodes on the mounting surface of the light-emitting element 1 are respectively bonded to positive and negative portions of the wiring on the mounting board 10 with electrically-conductive bonding members 11 therebetween. FIG. 2 is a simplified drawing in which the positive and negative electrodes of the light-emitting element 1 are not shown, but actually the positive and negative electrodes are disposed on the same surface such that the electrodes are electrically apart from each other. The positive and negative electrodes electrically apart from each other are respectively connected to the positive and negative portions of the wiring disposed on the mounting board 10 with the electrically-conductive bonding members 11 therebetween. The upper surface of the light-emitting element 1 serves as the main light exiting surface. As such a light-emitting element 1 is connected to the mounting board 10 using electrically-conductive bonding members, such as bumps and electrically-conductive pastes, as described above, the area of contact between the electrodes and the mounting board can be larger than in the case of a light-emitting element that is connected using metal wires or the like, so that the contact resistance can be reduced.

The light-emitting element 1 is, for example, a light-emitting element including a semiconductor layer on a light-transmissive support substrate. In this case, a surface of the support substrate serves as the main light exiting surface of the light-emitting element 1. More specifically, the light-emitting element 1 includes a sapphire substrate, which has a first surface and a second surface opposite to the first surface, and the semiconductor layer formed on the first surface. The second surface of the sapphire substrate serves as the main light-emitting surface of the light-emitting element 1.

A light-emitting element from which the support substrate has been removed can be used in the light-emitting device according to the present embodiment. In this case, the support substrate can be removed by, for example, polishing or laser lift-off (LLO).

Light-Transmissive Member 3

The light-transmissive member 3 can transmit light emitted from the light-emitting element 1 to the outside. The light-transmissive member 3 can contain a light-diffusing material and a phosphor that can perform wavelength conversion of at least a portion of incident light. The light-transmissive member 3 can comprise, for example, resin, glass, or an inorganic substance. Examples of the light-transmissive member containing a phosphor include a sintered body of a phosphor and a mixture of a phosphor and a substance such as resin, glass, ceramics, and other inorganic substances. Alternatively, a molded body of resin, glass, or a ceramic provided with a resin layer containing a phosphor on its surface can be used. The thickness of the light-transmissive member 3 is, for example, about 50 μm to 300 μm.

Phosphor

As described above, the light-transmissive member 3 can contain a phosphor. As the phosphor that can be contained in the light-transmissive member 3, a phosphor that can be excited by light emitted from the light-emitting element 1 is used. Examples of a phosphor that can be excited by a blue- or ultraviolet-light emitting element include cerium-activated yttrium-aluminum-garnet based phosphors (YAG:Ce); cerium-activated lutetium-aluminum-garnet based phosphors (LAG: Ce); europium- and/or chromium-activated nitrogen-containing calcium aluminosilicate phosphors ($CaO$—$Al_2O_3$—$SiO_2$:Eu and/or Cr); europium-activated silicate based phosphors (($Sr,Ba)_2SiO_4$:Eu); nitride phosphors such as β-SiAlON phosphors, CASN phosphors, and SCASN phosphors; KSF phosphors ($K_2SiF_6$:Mn); sulfide phosphors; and quantum-dot phosphors. Combining such a phosphor and a blue- or ultraviolet-light emitting element enables light-emitting devices to emit light of various colors. Specific example includes a light emitting device emitting white light.

In the light-emitting device 100, for example, a blue-light emitting element is used as the light-emitting element 1, and a light-transmissive member 3 containing a phosphor that is excited by light of the blue-light emitting element to emit light having longer wavelengths than blue light is used as the light-transmissive member 3. At this time, irradiation of the light-reflective member 7 with light emitted from the light-emitting surface of the light-emitting element is inhibited by the light-blocking layer 5. Deterioration of the light-reflective member 7 due to light emitted from the light-emitting element 1 can thus be reduced.

Accordingly, deterioration of the light-reflective member may be reduced, and high reliability of the light-emitting device according to the embodiment may be maintained, even in the case in which a blue-light emitting element with a short wavelength or an ultraviolet-light emitting element is used.

Light-Blocking Layer 5

The light-blocking layer 5 covers the region between the outer edge of the light-emitting surface of the light-emitting element 1 and the outer edge of the first main surface 3a of the light-transmissive member 3, and extends inward of the outer edge of the first main surface 3a.

Specifically, the light-blocking layer 5 covers the light-emitting surface of the light-emitting element 1 so as to have a flame shape along the outer edge of the light-emitting surface. In other words, the light-blocking layer covering the light-emitting surface of the light-emitting element 1 has an opening, and the light-transmissive member is disposed on the light-emitting element such that the first main surface encompasses the opening of the light-blocking layer. In this case, it is preferable that the distance between the outer edge of the opening of the light-blocking layer 5 and the outer edge of the first main surface 3a of the light-transmissive member 3 be substantially constant over the entire perimeter. The portion covered with the light-blocking layer 5 is thus shielded from light, so that deterioration of the light-reflective member 7 due to exposure to light emitted from the light-emitting element 1 is reduced. The light-blocking layer 5 is particularly effective for blocking blue light with short wavelengths or light with wavelengths shorter than the wavelengths of blue light having high energy, and is effective for reducing deterioration of the light-reflective member.

Considering this function, the light-blocking layer 5 is constituted of a member made of a material that reflects and/or absorbs light without or with less transmitting light. Examples of the light-blocking layer 5 include a metal film comprising metal or a member provided with a metal film on its surface. A metal film comprising metal is particularly preferable.

In the case in which the light-blocking layer 5 is a metal film, examples of the metal material comprising the metal film include a single layer or a multilayer film made of a metal such as Au, Ag, Cu, Fe, Ni, Cr, Al, Ti, Ta, W, Co, Ru, Sn, Ze, and Pb or an alloy of these metals (for example, an Al alloy include an alloy of Al and Cu, Ag, or a platinum-group metal such as Pt). Among these materials, a film comprising a metal such as Al, Ag, and Pt having a high reflectance is preferably used.

The light-blocking layer 5 can include a dielectric multilayer film or the like on a metal film. The light-blocking layer 5 can comprise a plurality of layers of two or more types of dielectric substances. A distributed Bragg reflector (DBR) film is preferably used as the dielectric multilayer film. Examples of dielectric substances constituting the DBR film include oxides and nitrides each containing at least one element selected from the group consisting of Si, Ti, Zr, Nb, Ta, and Al. Among these substances, a layered structure of oxides of elements such as Si, Zr, Nb, Ta, and Al is preferable.

The thickness of the light-blocking layer 5 (i.e., the height from the lower surface to the upper surface of the light-blocking layer 5) is preferably in the range of 0.1 μm to 100 μm, more preferably 0.5 μm to 10 μm, in consideration of the light-blocking property and the adhesion.

For example, the area ratio between the first main surface of the light-transmissive member 3 and the opening of the light-blocking layer preferably is in the range of 1:0.5 to 1:1. In this structure, light traveling upward from the light-emitting surface of the light-emitting element 1 is less likely directly leaking to the outside through the light-reflective member 7, so that the light-emitting device 100 in which a clear luminance difference is defined between a light-emitting region (i.e., the second main surface of the light-transmissive member 3) and a non-light-emitting region (i.e., the upper surface of the light-reflective member 7 surrounding the second main surface of the light-transmissive member), and small emission color non-uniformity can be provided.

The surface of the light-blocking layer 5 can be flat, but the surface preferably has fine irregularities. The adhesion to a material constituting the light-reflective member 7 described later is thus improved, and the light-blocking layer 5 can be more firmly fixed to the light-reflective member 7. Delamination of the light-blocking layer 5 from the light-reflective member 7 can be reduced.

Light-Reflective Member 7

The light-reflective member 7 covers at least a portion of the lateral surfaces of the light-emitting element 1 and at least a portion of the lateral surfaces of the light-transmissive member 3, and reflects light exited from the lateral surfaces of the light-emitting element 1 and the lateral surfaces of the light-transmissive member 3 to allow the light to be emitted from the second main surface 3b (i.e., the light-emitting surface of the light-emitting device) of the light-transmissive member 3. The luminance of the light-emitting device and the light extraction efficiency can be enhanced by disposing the light-reflective member 7 covering the at least a portion of lateral surfaces of the light-emitting element 1 and at least a portion of the lateral surfaces of the light-transmissive member 3 as described above. The light-reflective member 7 comprises, for example, a light-reflective material having a high light reflectance. Specifically, a light-reflective material having a reflectance with respect to light emitted from the light-emitting element 1 of 60% or more, more preferably 80% or 90% or more, is preferably used for the light-reflective member 7. The light-reflective material comprises, for example, a resin material containing a light-reflective substance.

Examples of the resin material of the base material constituting the light-reflective member 7 include resins such as silicone resins, modified silicone resins, epoxy resins, modified epoxy resins, acrylic resins, and hybrid resins each containing at least one of these resins. Examples of the light-reflective substance contained in the resin material include titanium oxide, silicon oxide, zirconium oxide, magnesium oxide, yttrium oxide, yttria-stabilized zirconia, calcium carbonate, calcium hydroxide, calcium silicate, niobium oxide, zinc oxide, barium titanate, potassium titanate, magnesium fluoride, alumina, aluminum nitride, boron nitride, and mullite. Titanium oxide ($TiO_2$) is preferable. It is preferable that particles having a refractive index different from the refractive index of the base resin can be used as the light-reflective substance to be dispersed in the base resin. As the amounts of reflection and transmission of light vary depending on the concentration and density of the light-reflective substance, the concentration and density may be appropriately adjusted depending on the shape and size of the light-emitting device.

The light-reflective member 7 can contain another substance such as pigment, phosphor, and the like in addition to the light-reflective substance. For example, in the case in which the light-transmissive member contains the phosphor and in which the lateral surfaces of the light-emitting element are exposed from the light-blocking layer, if the light-reflective member covering the lateral surfaces of the light-emitting element is thin, light emitted from the lateral surfaces of the light-emitting element can be transmitted through the light-reflective member to the outside to cause leakage of light from the lateral surfaces of the light-emitting device. Adding a small amount of phosphor to the light-reflective member 7 allows the color of the leaking light to coincide with the emission color of the light-emitting device.

Light Guide Member 9

The light-transmissive member 3 can be bonded to the light-emitting element 1 using, for example, a light guide member 9 as shown in FIG. 2. In the light-emitting device in FIG. 2, the light-transmissive member 3 is disposed on or above the light-emitting element 1 and the light-blocking layer 5 such that the outer edge of the first main surface 3a of the light-transmissive member 3 is in contact with the light-blocking layer 5. Accordingly, light emitted from the light-emitting surface of the light-emitting element 1 is guided to the light-transmissive member 3, but is less likely to leak through the gap between the first main surface 3a of the light-transmissive member 3 and the light-blocking layer 5 to the light-reflective member 7. The light guide member 9 can be disposed between the first main surface 3a of the light-transmissive member 3 and the light-blocking layer 5. In this case, the light guide member 9 disposed between the first main surface 3a of the light-transmissive member 3 and the light-blocking layer 5 is preferably thin to reduce transmission of light emitted from the light-emitting surface of the light-emitting element 1 to the light-reflective member 7 through the light guide member 9.

In certain embodiments, the light-transmissive member 3 can be bonded to the light-emitting element 1 without employing the light guide member 9. For example, in the case in which the light-transmissive member 3 comprises an inorganic material, direct bonding such as surface-activated bonding, atomic diffusion bonding, and hydroxy-group bonding can be employed.

The light guide member 9 is preferably made of a resin material because resin materials are easy to handle and process. A resin material made of a resin or hybrid resin containing at least one of silicone resins, modified silicone resins, epoxy resins, modified epoxy resins, acrylic resins, and fluorocarbon resins can be used as the resin material. The light guide member 9 can have the aforementioned shape by appropriately adjusting the viscosity of the resin material constituting the light guide member 9 and the wettability of the light-emitting elements 1 by the resin material.

Other Members

The light-emitting device can include other components such as a protective element and electronic components. These elements and electronic components are preferably embedded in the light-reflective member 7.

Method of Manufacturing Light-Emitting Device

The method of manufacturing a light-emitting device according to certain embodiments is described referring to the accompanying drawings.

Producing Light-Emitting Element

A step of producing light-emitting elements includes, for example, producing a set of light-emitting elements 1 on which a light-blocking layer 5 is formed so as to be positioned on the outer edge of each of the light-emitting surfaces. Each of the light emitting elements includes an n-type layer, an active layer, and a p-type layer on a support substrate such as a sapphire wafer. Subsequently, the set of the light-emitting elements is divided into individual light-emitting elements 1.

Specifically, for example, the n-type layer, the active layer, and the p-type layer comprising a nitride semiconductor are formed on or above the first surface of the support substrate.

An n-side electrode and a p-side electrode are formed in each of regions respectively corresponding to the light-emitting elements 1.

The p-side electrode is formed on the surface of the p-type layer, and the n-side electrode is, for example, formed on the surface of the n-type layer exposed by removing portions of the p-type layer and the active layer in each region.

The light-blocking layer 5 comprising metal is formed by, for example, sputtering on the entire second surface opposite to the first surface on which the semiconductor layer has been formed.

Figure 4A:
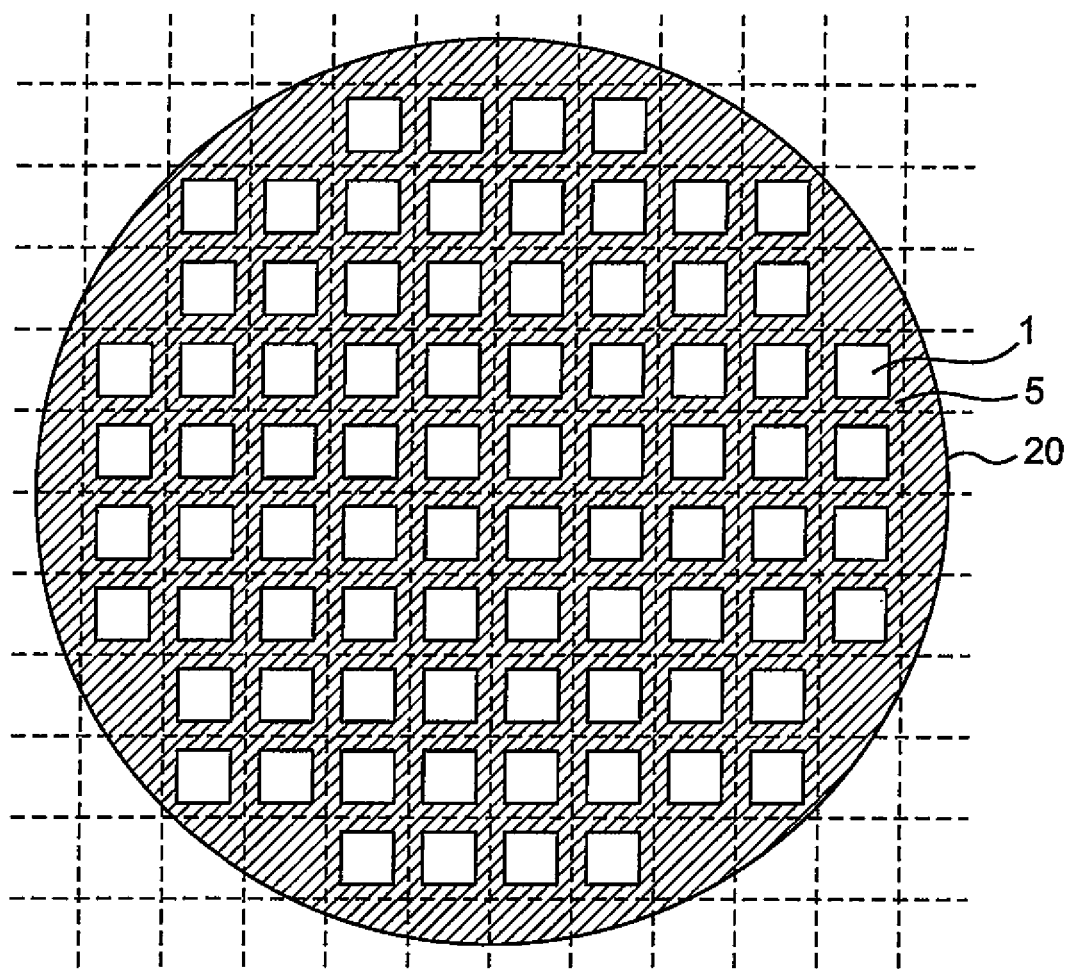
FIG. 4A is a schematic plan view of a light-emitting element formation substrate including light-emitting elements produced together in each of which a light-blocking layer is formed on the outer edge of the light-emitting surface and its vicinity in a method of manufacturing the light-emitting device according to the embodiment.

Openings are respectively formed in the regions corresponding to the light-emitting elements 1 as shown in FIG. 4A. The openings are formed by, for example, removing the light-blocking layer at positions corresponding to the openings by etching or lift-off. The shape and the position of each opening can be selected such that its center coincides with the center of the region corresponding to each light-emitting element and such that a predetermined width of the light-blocking layer 5 is left with cutting lines indicated by dashed lines shown in FIG. 4A being center lines.

As described above, a light-emitting element formation substrate 20 including the set of the light-emitting elements 1 produced in each of which the light-blocking layer 5 is formed on the outer edge of each of the light-emitting surfaces can be obtained.

The light-emitting element formation substrate 20 is cut into individual light-emitting elements 1 by dicing or the like along the cutting lines indicated by dashed lines shown in FIG. 4A.

Mounting Light-Emitting Elements

Figure 4B:
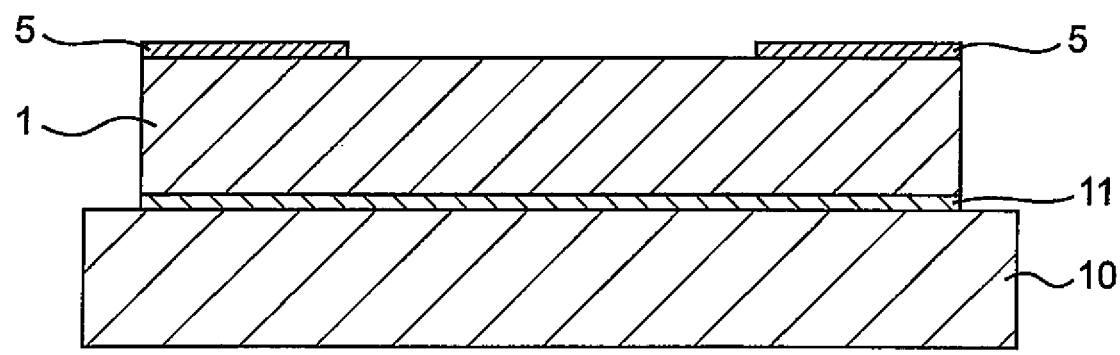
FIG. 4B is a schematic cross-sectional view of the light-emitting element, on which the light-blocking layer is formed, mounted on or above a mounting board in the method of manufacturing the light-emitting device according to the embodiment.

In this step, each light-emitting element 1 is flip-chip mounted on or above the mounting board 10 as shown in FIG. 4B.

Specifically, for example, the positive and negative electrodes are formed on the semiconductor layer formed on the first surface opposite to the second surface, on which the light-blocking layer 5 has been formed, of the support substrate of the light-emitting element 1. The positive and negative electrodes are bonded using the electrically-conductive bonding members 11 so as to face the wiring disposed on the mounting board 10.

FIG. 4B is an enlarged view of a region corresponding to single light-emitting device, but actually the light-emitting elements 1 are respectively flip-chip mounted in a plurality of regions in the mounting board 10. The mounting board is cut after a step of bonding the light-transmissive members and a step of forming a light-reflective member, thereby producing individual light-emitting devices.

The arrangement or configuration of the light-emitting elements 1 to be flip-chip mounted on or above the undivided mounting board is preferably systematic. The distance between adjacent light-emitting elements 1 is selected such that a predetermined thickness of light-reflective member 7 is left on at least a portion of the lateral surfaces of the light-emitting element 1 and the light-transmissive member 3 in each of the individual light-emitting devices produced by cutting after the step of forming a light-reflective member.

For example, a mounting board as the undivided mounting board can include a plurality of (i.e., n×m) unit regions respectively corresponding to the light-emitting devices and forming a plurality of rows (i.e., n rows) and a plurality of columns (i.e., m columns).

A step shown in FIG. 4C and description below referring to FIG. 4C and other drawings is also performed in the set of a plurality of light-emitting devices on the undivided mounting board.

Bonding Light-Transmissive Members

Figure 4C:
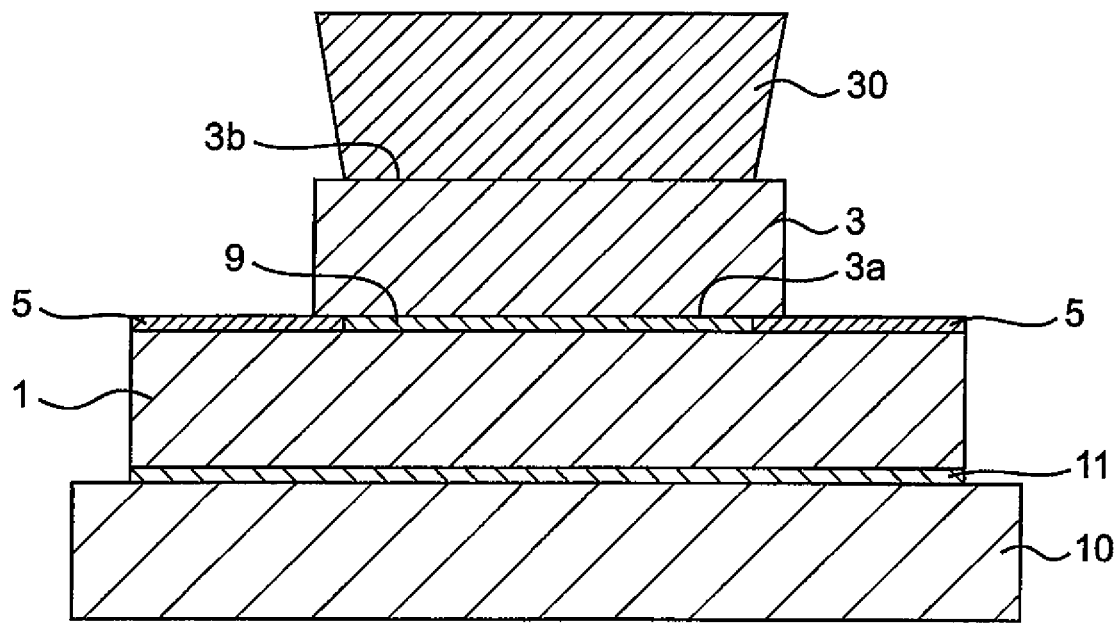
FIG. 4C is a schematic cross-sectional view of the light-emitting device after bonding of a light-transmissive member on or above the light-emitting surface of the light-emitting element and on the light-blocking layer in the method of manufacturing the light-emitting device according to the embodiment.

In this step, the light-transmissive member 3 is bonded such that the first main surface 3a of the light-transmissive member 3 faces the light-emitting surface of the light-emitting element 1 and the light-blocking layer 5 as shown in FIG. 4C.

For example, a suction collet 30 sucks up the second main surface 3b of the light-transmissive member 3, and is moved downward at such a position that the outer edge of the first main surface 3a of the light-transmissive member 3 is located on the light-blocking layer 5 (i.e., in the region between the outer and inner edges of the light-blocking layer 5 as shown in FIG. 1).

When the light-transmissive member 3 is bonded to the light-emitting element 1, the light guide member 9 can be preliminarily applied on the first main surface 3a of the light-transmissive member 3 before the light-transmissive member 3 is placed on or above the light-emitting element 1 and the light-blocking layer 5. Alternatively, the light guide member 9 can be applied on the upper surface of the light-emitting element 1 before the light-transmissive member 3 is placed on or above the light-emitting element 1 and the light-blocking layer 5. The light guide member 9 can be formed, for example, using a resin. In this case, the amount of the light guide member 9 to be applied, the load when the light-transmissive member 3 is placed on or above the light-emitting element 1 and the light-blocking layer 5 and pressed, the viscosity of the resin material to be applied, can be appropriately selected in consideration of other manufacturing conditions.

In the case in which the light-transmissive member 3 is formed using an inorganic material, the light-transmissive member 3 can be directly bonded to the light-emitting element 1 by surface-activated bonding, atomic diffusion bonding, or hydroxy-group bonding in the step of bonding the light-transmissive members as described above.

Forming Light-Reflective Member

Figure 4D:
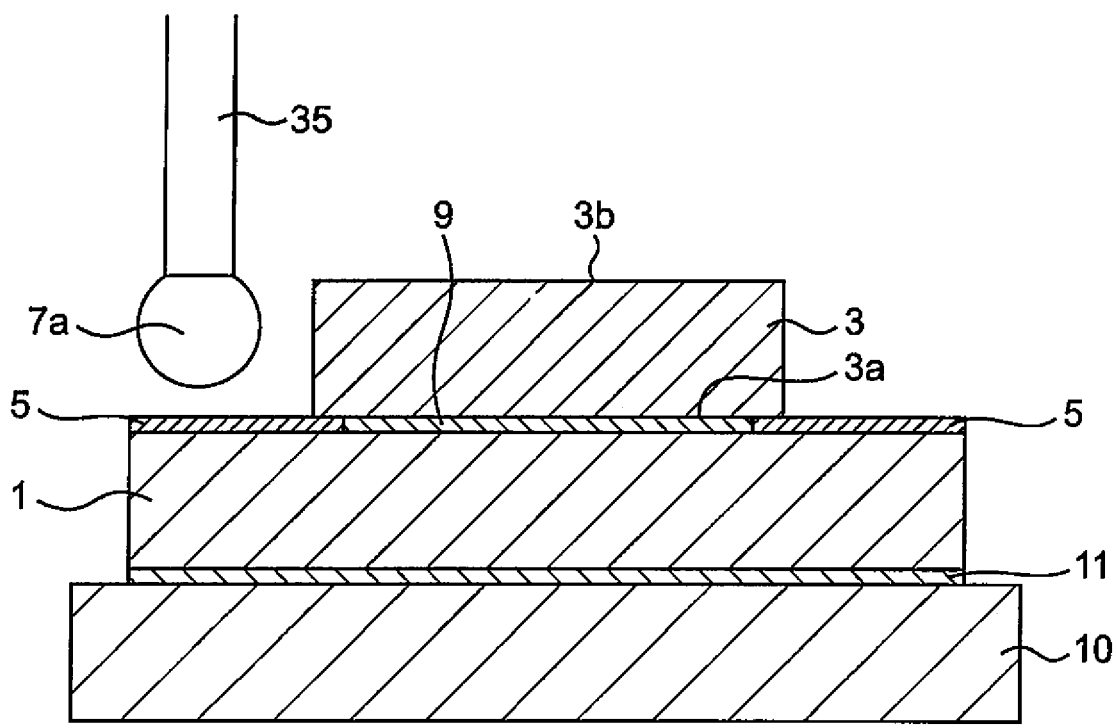
FIG. 4D is a schematic cross-sectional view for illustrating supplying of a light-reflective resin in the method of manufacturing the light-emitting device according to the embodiment.

In this step, an uncured resin material (hereinafter the uncured resin material for the light-reflective member is referred to as a light-reflective resin) constituting the light-reflective member 7 is supplied into the gap between adjacent light-emitting elements 1 bonded to the light-transmissive members 3, and is cured to form the light-reflective member 7 covering at least a portion of the lateral surfaces of the light-emitting elements 1 and at least a portion of the light-transmissive members 3. In certain embodiments, for example, a nozzle 35 of a resin discharging device is positioned above the gap between the adjacent light-emitting elements 1 bonded to the light-transmissive members 3 as shown in FIG. 4D, a light-reflective resin 7a is discharged from the tip of the nozzle 35 to supply the light-reflective resin into the gap, and the supplied light-reflective resin 7a is then cured.

Cutting

After the light-reflective resin 7a is cured, the set of the light emitting devices are divided into individual light-emitting devices.

The light-emitting device according to certain embodiments is manufactured as described above.

By the above method of manufacturing light-emitting devices, the light-emitting devices can be manufactured at a low cost because a plurality of light-emitting devices are produced in a set on the undivided mounting board, and then divided into individual light-emitting devices.

Modification

A light-emitting device according to other embodiments will be described below.

Figure 5:
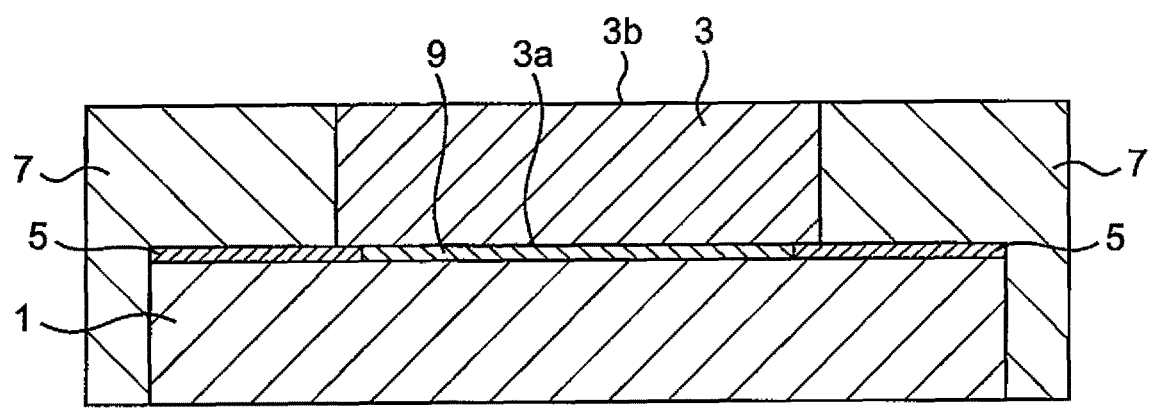
FIG. 5 is a schematic cross-sectional view of the structure of a light-emitting device according to a modification.

The light-emitting device according to other embodiments has substantially the same structure as the light-emitting device according to the previously-discussed embodiments except that the mounting board 10 is not included as shown in FIG. 5.

The light-emitting device according to some embodiments can be slimmer than the light-emitting device according to the previously discussed embodiments.

For example, the light-emitting device according to other embodiments can be produced as described below.

The light-emitting elements 1 are produced through the step of producing light-emitting elements in the manufacturing method according to the embodiment, and the light-emitting elements 1 are disposed on a sheet in a predetermined arrangement. This step is also referred to as a step of placing the light-emitting elements.

In the step of placing the light-emitting elements, a sheet is used instead of the undivided mounting board used in the step of mounting the light-emitting elements, and the light-emitting elements are disposed on the sheet at predetermined intervals in a predetermined configuration.

For example, a heat resistant sheet having an adhesive surface can be used as the sheet. Example materials of the sheet include a polyimide.

Similarly to the manufacturing method according to the previously discussed embodiments, a plurality of light-emitting devices are produced in a set on the sheet through the step of bonding the light-transmissive members and the step of forming a light-reflective member after the step of placing the light-emitting elements. FIG. 5 shows one of the set of the light emitting devices.

The light-emitting devices produced as a set on the sheet are divided into individual light-emitting devices. The sheet can be removed either before or after cutting into individual light-emitting devices.

As described above, the light-emitting device according to these embodiments can be produced in which the light-emitting element 1 and the light-transmissive member 3 are supported by the light-reflective member 7 surrounding the light-emitting element 1 and the light-transmissive member 3, and in which the n-side electrode and the p-side electrode of the light-emitting element 1 exposed on the mounting surface opposite to the light exiting surface are used as the external connection electrodes.

In the methods for manufacturing light-emitting devices according to certain embodiments, a plurality of light-emitting devices are produced together in a set before cutting into individual light-emitting devices.

However, the light-emitting devices can individually be produced instead of producing the light-emitting devices together in a set.

What is claimed is:

1. A light-emitting device comprising:
a light-emitting element;
a light-transmissive member having a first main surface and a second main surface opposite to each other, the first main surface and the second main surface being smaller than a light-emitting surface of the light-emitting element, and the first main surface facing the light-emitting surface of the light-emitting element;
a light-blocking layer disposed on the light-emitting surface to cover a region between an outer edge of the light-emitting surface and an outer edge of the first main surface; and
a light-reflective member covering at least a portion of lateral surfaces of the light-emitting element and at least a portion of lateral surfaces of the light-transmissive member,
wherein the light-blocking layer extends inward of the outer edge of the first main surface.

2. The light-emitting device according to claim 1, wherein the light-blocking layer further covers at least a portion of the lateral surface of the light-emitting element.

3. The light-emitting device according to claim 1, wherein the light-blocking layer comprises a metal film.

4. The light-emitting device according to claim 3, wherein the metal film comprises at least one metal selected from a group consisting of Au, Ag, and Pt.

5. The light-emitting device according to claim 1, further comprising a mounting board,
wherein the light-emitting element is mounted on or above the mounting board with a surface opposite to the light-emitting surface being a mounting surface.

6. The light-emitting device according to claim 1,
wherein the light-emitting element comprises:
a sapphire substrate having a first surface and a second surface opposite to the first surface; and
a semiconductor layer on the first surface,
and wherein the second surface of the sapphire substrate serves as the light-emitting surface.

7. The light-emitting device according to claim 1,
wherein the light-blocking layer has an opening, and
wherein the light-transmissive member is disposed on or above the light-emitting element such that the first main surface of the light-transmissive member encompasses the opening.

8. The light-emitting device according to claim 1, wherein an area ratio between the first main surface of the light-transmissive member and an opening of the light-blocking layer is 1:0.5 to 1:1.

9. The light-emitting device according to claim 1, wherein the light-emitting element comprises a blue-light emitting element or ultraviolet-light emitting element.

10. The light-emitting device according to claim 1, wherein the light-transmissive member comprises a phosphor.

11. The light-emitting device according to claim 1, wherein the light-reflective member comprises a resin material.

12. The light-emitting device according to claim 1, further comprising a light guide member positioned between the first main surface of the light-transmissive member and the light-blocking layer.

* * * * *